(12) United States Patent
Chen

(10) Patent No.: US 8,150,349 B2
(45) Date of Patent: Apr. 3, 2012

(54) APPARATUS AND METHOD FOR AUDIO CONVERSION

(75) Inventor: ShouFang Chen, Hsinchu County (TW)

(73) Assignee: MStar Semiconductor, Inc (TW)

(*) Notice: Subject to any disclaimer, the term of this patent is extended or adjusted under 35 U.S.C. 154(b) by 0 days.

(21) Appl. No.: 12/163,264

(22) Filed: Jun. 27, 2008

(65) Prior Publication Data

US 2011/0116655 A1 May 19, 2011

(30) Foreign Application Priority Data

Jun. 29, 2007 (TW) ................................ 96123916 A

(51) Int. Cl.
*H04B 1/18* (2006.01)
(52) U.S. Cl. .................. 455/182.3; 455/91; 455/192.3; 455/178.1; 455/180.3; 455/190.1
(58) Field of Classification Search .................. 455/91, 455/102, 112, 113, 126, 77, 182.3, 192.3, 455/165.1, 178.1, 180.3, 183.1, 190.1, 191.1
See application file for complete search history.

(56) References Cited

U.S. PATENT DOCUMENTS

| | | | | |
|---|---|---|---|---|
| 3,676,794 A * | 7/1972 | Bidell et al. | ..................... | 331/11 |
| 5,784,413 A * | 7/1998 | Chen | ............................. | 375/308 |
| 5,801,589 A * | 9/1998 | Tajima et al. | ................. | 331/1 R |
| 6,236,267 B1* | 5/2001 | Anzil | ............................. | 330/149 |
| 2005/0156781 A1* | 7/2005 | Coleman et al. | .............. | 342/174 |

* cited by examiner

*Primary Examiner* — Tuan Pham

(57) ABSTRACT

An apparatus and method for audio conversion is provided to upgrade the resolution of transmission frequency of an FM (frequency modulation) transmitter and reduce the size of the FM transmitter by applying frequency coarse tune and fine tune. The apparatus comprises a digital FM modulator, a digital frequency synthesizer, a signal converter, and an analog frequency converter. The digital FM modulator modulates a digital audio input signal into a first digital audio signal. The digital frequency synthesizer converts the first digital audio signal into a second digital audio signal, whose frequency is determined according to a first frequency conversion parameter. The signal converter converts the second digital audio signal into an analog audio signal. The analog frequency converter generates an audio transmission signal with a predetermined frequency according to a second clock signal and the analog audio signal while the second clock signal is generated according to a first clock signal.

15 Claims, 5 Drawing Sheets

APPARATUS AND METHOD FOR AUDIO CONVERSION

BACKGROUND OF INVENTION

1. Field of the Invention

The present invention relates to audio conversion, and more particularly to an apparatus and method for audio conversion applied in an FM (frequency modulation) transmitter.

2. Description of the Prior Art

FM transmitters have been widely applied. For example, an FM transmitter can be used in the car to connect to a digital music player, such as the iPOD player, so as to utilize the FM audio facility equipped in the car to listen to the music played by the digital music player. However, the conventional FM transmitter has two main disadvantages. Firstly, the resolution of transmission frequency is very limited so that the actual applicable transmission frequency is insufficient, thereby possibly jamming the commercial FM broadcast frequencies and thus causing inconvenience for use. Secondly, the size of the FM transmitter is large and the manufacturing cost is high.

SUMMARY OF INVENTION

It is therefore one objective of the present invention to provide an apparatus and method for audio conversion capable of coarse-tuning and fine-tuning the frequency to increase the resolution of transmitting frequency for an FM transmitter.

Another objective of the present invention is to provide an apparatus and method for audio conversion which can reduce the size of an FM transmitter.

An apparatus for audio conversion is provided. The apparatus comprises: a digital FM modulator for modulating a digital audio input signal into a first digital audio signal; a digital frequency synthesizer for frequency-synthesizing the first digital audio signal into a second digital audio signal; a signal converter, coupled to the digital frequency synthesizer, for frequency-synthesizing the second digital audio signal into an analog audio signal; and an analog frequency converter, coupled to the signal converter, for generating an audio transmission signal with a predetermined frequency according to a second clock signal and the analog audio signal. The second clock signal is generated according to a first clock signal. A frequency of the second digital audio signal is determined according to a first frequency conversion parameter, and a frequency of the second clock signal is determined according to a frequency of the first clock signal and a second frequency conversion parameter, so that the predetermined frequency is determined according to the frequency of the second clock signal and a frequency of the analog audio signal.

A method for audio conversion is provided. The method comprises: direct-digital-synthesizing a digital audio signal to fine-tune a frequency of the digital audio signal; converting the fine-tuned digital audio signal into an analog audio signal; generating a coarse-tuned signal according to a clock signal by phase-locking; and mixing the analog audio signal with the coarse-tuned signal to generate an audio transmission signal with a predetermined frequency.

DETAILED DESCRIPTION

Figure 1:
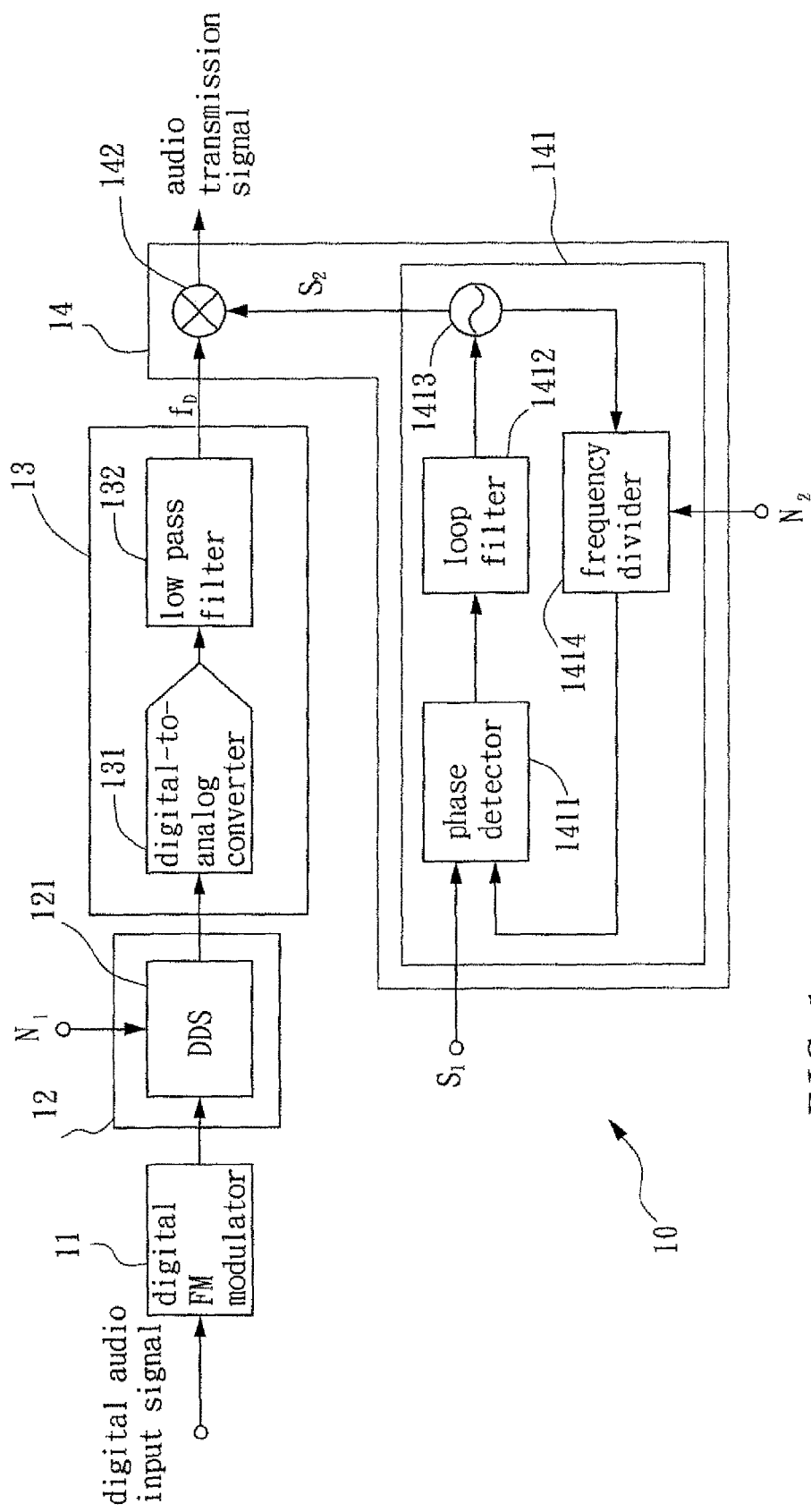
FIG. 1 is a block diagram of an audio conversion apparatus according to a preferred embodiment of the present invention.

FIG. 1 is a block diagram of an audio conversion apparatus 10 according to a preferred embodiment of the present invention. The audio conversion apparatus 10 converts a digital audio signal to an audio transmission signal in an FM frequency band, such as 76~108 MHz, for FM transmission. The audio conversion apparatus 10 performs digital frequency conversion and analog frequency conversion according to a first frequency conversion parameter and a second frequency conversion parameter, so as to convert the digital audio signal to the audio transmission signal with a predetermined frequency in the FM frequency band. The audio conversion apparatus 10 includes a digital FM modulator 11, a digital frequency synthesizer 12, a signal converter 13 and an analog frequency converter 14. The digital FM modulator 11 receives a digital audio input signal and digitally modulates the digital audio input signal into a first digital audio signal, which is an FM audio signal in FM format. The first digital audio signal can be a stereo signal or a mono signal. The digital frequency synthesizer 12 includes a direct digital synthesizer (DDS) 121 for frequency-synthesizing the FM audio signal outputted from the digital FM modulator 11 into a second digital audio signal with a frequency $f_D$ determined according to the first frequency conversion parameter $N_1$. For example, the direct digital synthesizer 121 configures a step size for frequency adjustment, and the frequency $f_D$ of the second digital audio signal is the product of the first frequency conversion parameter $N_1$ and the step size. That is, when the value of $N_1$ is incremented or decremented by one, $f_D$ is incremented or decremented by the step size. The direct digital synthesizer 121 can be understood by persons skilled in the art and thus will not be discussed in detail.

The signal converter 13 includes a digital-to-analog converter 131 and a low pass filter 132. The digital-to-analog converter 131 converts the second digital audio signal outputted by the digital frequency synthesizer 12 into an analog audio signal. The low pass filter 132 performs low pass filtering to the analog audio signal.

The analog frequency converter 14 includes a phase locked loop (PLL) 141 and a mixer 142. The phase locked loop 141 generates a second clock signal S2 according to a first clock signal S1. As shown in FIG. 1, the phase locked loop 141 includes a phase detector 1411, a loop filter 1412, a voltage controlled oscillator (VCO) 1413 and a frequency divider 1414. The first clock signal S1 enters the phase detector 1411. After the second clock signal S2, generated by the phase locked loop 141, is divided by the frequency divider 1414 (the divisor is the second frequency conversion parameter $N_2$), the second to clock signal S2 is fed back to the phase detector 1411 such that the frequency of the second clock signal S2 is equal to the product of the frequency of the first clock signal S1 and the second frequency conversion parameter $N_2$.

The mixer 142 mixes the filtered analog audio signal from the low pass filter 132 with the second clock signal S2 from the VCO 1413 to generate an audio transmission signal. The center frequency of the audio transmission signal is the sum of the frequency of the second clock signal S2 and the frequency $f_D$ of the analog audio signal.

In this embodiment, the analog frequency converter 14 coarse-tunes the frequency of the audio transmission signal. When the value of the second frequency conversion parameter is incremented by one, the change of the frequency of the audio transmission signal is greater than that caused by fine-tune by incrementing the frequency value of the first clock signal by one. For example, if the first clock signal is 1 MHz, the frequency of the audio transmission signal will increase or decrease by 1 MHz when the second frequency conversion parameter is incremented or decremented by one. On the other hand, the digital frequency synthesizer 12 fine-tunes the frequency of the audio transmission signal. The step size of the direct digital synthesizer 121 is designed to be a smaller value, such as 0.01 M. The frequency of the audio transmission signal will increase or decrease by 0.01 MHz when the first frequency conversion parameter is incremented or decremented by one. Through the coarse tune and fine tune, the frequency resolution of the audio transmission signal is significantly enhanced, such as 0.01 M, so as to prevent from occupying FM frequencies in normal use.

Figure 2:
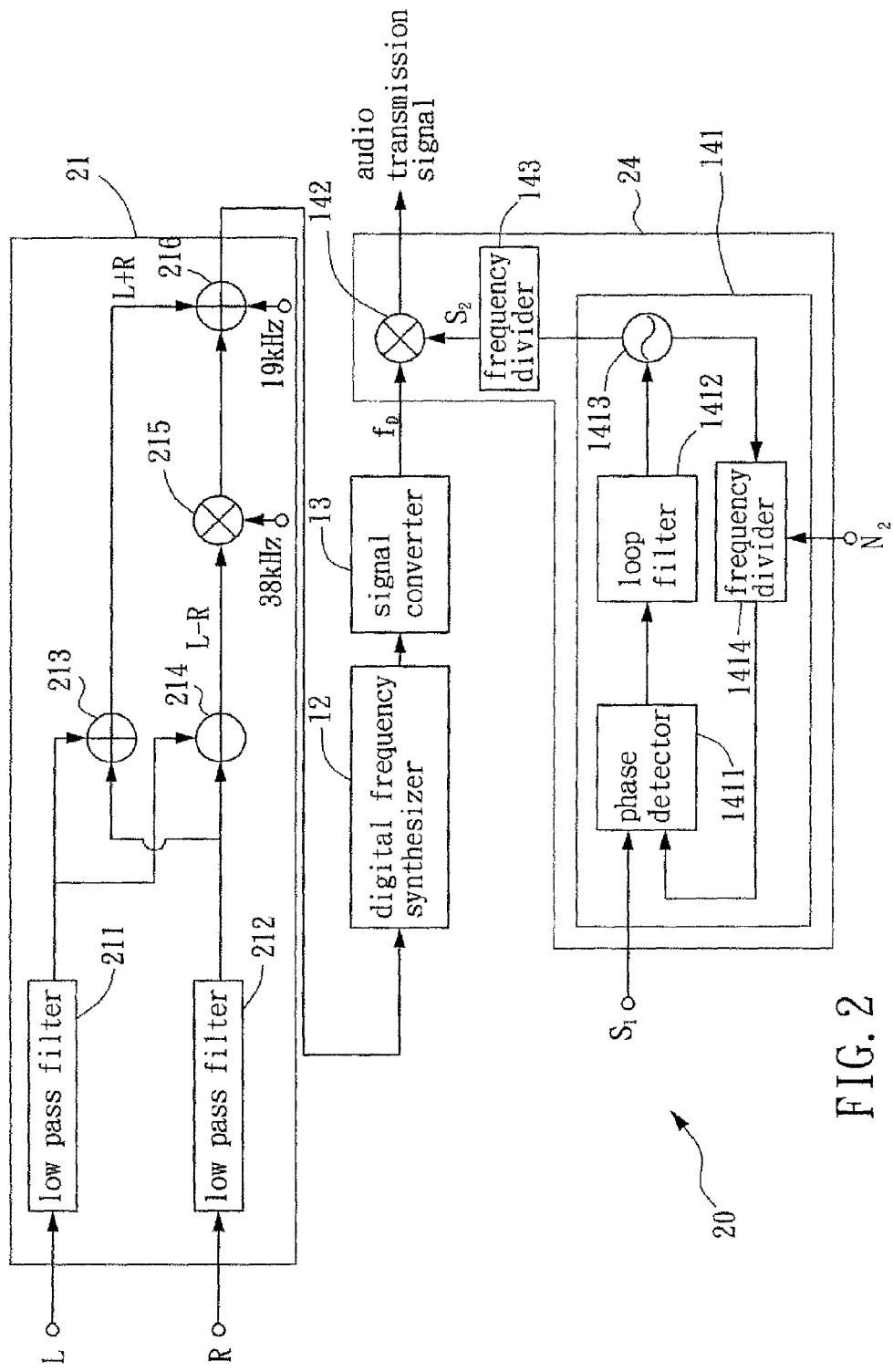
FIG. 2 is a block diagram of an audio conversion apparatus according to another preferred embodiment of the present invention.

FIG. 2 is a block diagram of an audio conversion apparatus 20 according to another preferred embodiment of the present invention. The audio conversion apparatus 20 includes a digital FM modulator 21, the digital frequency synthesizer 12, the signal converter 13 and an analog frequency converter 24. The digital FM modulator 21 receives a digital audio input signal which includes a digital left channel signal L and a digital right channel signal R. After passing the low pass filters 211 and 212, e.g. both having a cut-off frequency of 15 kHz, the L and R signals are sent to an adder 213 and a subtracter 214 so as to generate a left plus right channel signal (L+R) and a left minus right channel signal (L−R), respectively. The L−R signal is then sent to a digital modulator 215 with a center frequency of 38 kHz for digital modulation. Then, the L+R signal, the modulated L−R signal and a clock signal of 19 kHz are sent to an adder 216 so as to generate the FM audio signal in FM format, which is then output to the digital frequency synthesizer 12. In FIG. 2, the operation of the digital frequency synthesizer 12 and the signal converter 13 is similar to that in FIG. 1 and thus will not be described in detail here.

In FIG. 2, preferably, the first clock signal with a higher frequency is applied in the analog frequency converter 24 to increase the bandwidth of the loop filter 1412 in the phase locked loop 141. The RC time constant thereof is decreased accordingly. Thus, a smaller capacitance can be applied to implement the loop filter 1412. Decreasing the capacitance in the loop filter 1412 reduces the IC area occupied by the loop filter 1412, so as to facilitate integrating the audio conversion apparatus 20 into a single integrated circuit (IC), thereby reducing the size of the audio conversion apparatus 20, for use in the FM transmitter. Further, the analog frequency converter 24 can be provided with a frequency divider 143 between the mixer 142 and the VCO 1413, so as to reduce the step size of the frequency coarse tuning. For example, if the first clock signal is 4 MHz, then the frequency divider 143 can be a divide-by-four frequency divider. Thus, the step size of the frequency coarse tuning can still be to maintained at 1 MHz.

Figure 3:
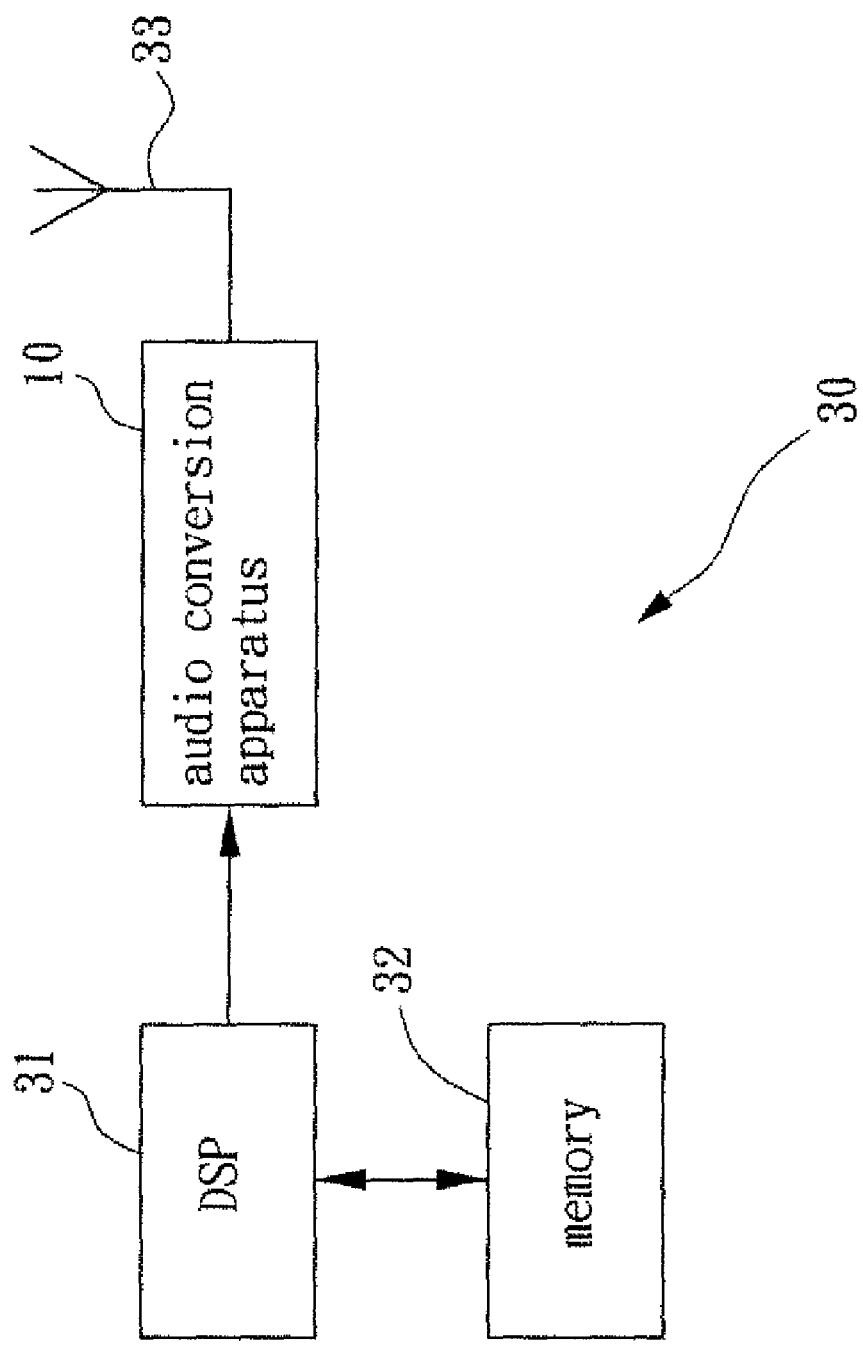
FIG. 3 is a block diagram of an FM transmitter utilizing the audio conversion apparatus of FIG. 1 according to an embodiment of the present invention.

The audio conversion apparatuses 10 and 20 in FIGS. 1 and 2 can be applied in an FM transmitter, as shown in FIG. 3. The FM transmitter 30 includes the audio conversion apparatus 10 or the audio conversion apparatus 20, a digital signal processor (DSP) 31, a memory 32 and an antenna 33. The digital signal processor 31 reads digital audio data, including, but not limited to, MP3, WMA and WAV formats, from the memory 32, and processes the read data to generate a digital audio input signal, which is then sent to the audio conversion apparatus 10. For example, the memory 32 is a built-in random access memory (RAM), a flash memory, or an external storage device, e.g. a flash card. Preferably, the built-in RAM cooperates with the external flash card, which can be shared by a mobile phone, so as to provide non-volatile storage for users' favorite music albums. The digital signal processor 31 determines the first and second frequency conversion parameters according to a transmission frequency of the FM transmitter 30 predetermined by the user, and then sends the parameters to the audio conversion apparatus 10. The audio conversion apparatus 10 converts the digital audio input signal to an audio transmission signal with the predetermined frequency according to the first and second frequency conversion parameters, and then transmits the audio transmission signal out through the antenna 33.

Determining the first frequency conversion parameter $N_1$ and the second frequency conversion parameter $N_2$ according to the predetermined frequency of the FM transmitter 30 is further described.

Assuming the predetermined frequency is $f_{TX}$, the step size used for frequency adjustment by the direct digital synthesizer 121 is S, and the frequencies of the first clock signal and the second clock signal are $f_1$ and $f_2$ respectively, then $$f_{TX} = f_2 + f_D = N_2 * f_1 + N_1 * S$$

$$N_2 = \text{INT}((f_{TX} - f_D)/f_1)$$

Since $f_{TX} \gg f_D$;

$$N_2 = \text{INT}((f_{TX} - f_D)/f_1) = \text{INT}(f_{TX}/f_1) \qquad \text{Eq(1)}$$

$$N_1 = (f_{TX} - N_2 * f_1)/S \qquad \text{Eq(2)}$$

The INT function in Eq (1) means that the integer part of $(f_{TX} - f_D)/f_1$ is provided. Since $f_D$ generated by the frequency fine tune is far smaller than the predetermined transmission frequency $f_{TX}$, it can be omitted when compared with $f_{TX}$. With the given $f_{TX}$, $f_1$ and S, $N_1$ and $N_2$ can be determined by Eqs (1) and (2).

For instance, if $f_{TX}$ is 76.1 MHz, $f_1$ is 1 MHz, and S is 0.01 MHz, then $$N_2 = \text{INT}(76.1/1) = 76$$

$$N_1 = (76.1 - 76*1)/0.01 = 10$$

In the FM frequency band, for each transmission frequency that can be used by the FM transmitter 30, a corresponding set of the first and second frequency conversion parameters can be determined by Eqs (1) and (2), exemplified as shown in Table 1. Preferably, each transmission frequency and the corresponding first and second frequency conversion parameters are stored in a lookup table built in the digital signal processor 31 or the memory 32 of FIG. 3. In this manner, the digital signal processor 31 looks up the lookup table according to the selected transmission frequency, and sends the first and second frequency conversion parameters obtained from the lookup table to the audio conversion apparatus 10.

TABLE 1

| Transmission Frequency (MHz) | First Frequency Conversion Parameter | Second Frequency Conversion Parameter |
|---|---|---|
| 76.1 | 10 | 76 |
| 76.3 | 30 | 76 |
| 76.5 | 50 | 76 |
| 76.7 | 70 | 76 |
| 76.9 | 90 | 76 |
| 77.1 | 10 | 77 |
| 77.3 | 30 | 77 |
| 77.5 | 50 | 77 |

TABLE 1-continued

| Transmission Frequency (MHz) | First Frequency Conversion Parameter | Second Frequency Conversion Parameter |
|---|---|---|
| 77.7 | 70 | 77 |
| 77.9 | 90 | 77 |
| 78.1 | 10 | 78 |
| 78.3 | 30 | 78 |
| 78.5 | 50 | 78 |
| 78.7 | 70 | 78 |
| 78.9 | 90 | 78 |
| 79.1 | 10 | 79 |
| 79.3 | 30 | 79 |
| 79.5 | 50 | 79 |
| 79.7 | 70 | 79 |
| 79.9 | 90 | 79 |
| 80.1 | 10 | 80 |
| 80.3 | 30 | 80 |
| 80.5 | 50 | 80 |
| 80.7 | 70 | 80 |
| 80.9 | 90 | 80 |

Figure 4:
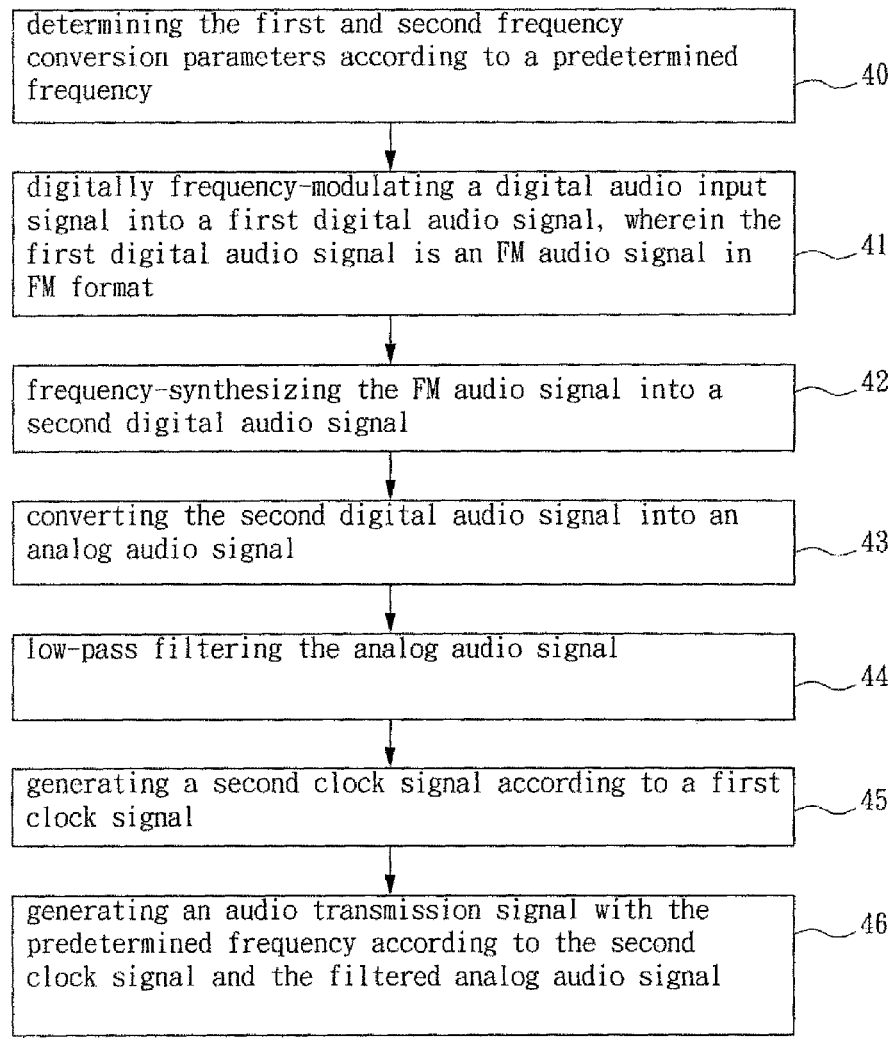
FIG. 4 is a flow chart of an audio conversion method according to a preferred embodiment of the present invention.

FIG. 4 shows a flow chart of an audio conversion method according to a preferred embodiment of the present invention. The audio conversion method includes the following steps:

Step 40: determining the first frequency conversion parameter and the second frequency conversion parameter according to a predetermined frequency.

Step 41: digitally frequency-modulating a digital audio input signal into a first digital audio signal, wherein the first digital audio signal is an FM audio signal in FM format.

Step 42: frequency-synthesizing the FM audio signal into a second digital audio signal, wherein the frequency of the second digital audio signal is determined according to the first frequency conversion parameter.

Step 43: converting the second digital audio signal into an analog audio signal.

Step 44: low-pass filtering the analog audio signal.

Step 45: generating a second clock signal according to a first clock signal, wherein the frequency of the second clock signal is determined according to the product of the frequency of the first clock signal and the second frequency conversion parameter.

Step 46: generating an audio transmission signal with the predetermined frequency according to the second clock signal and the filtered analog audio signal, wherein the predetermined frequency of the audio transmission signal is generated according to the frequencies of the second clock signal and the analog audio signal.

Figure 5:
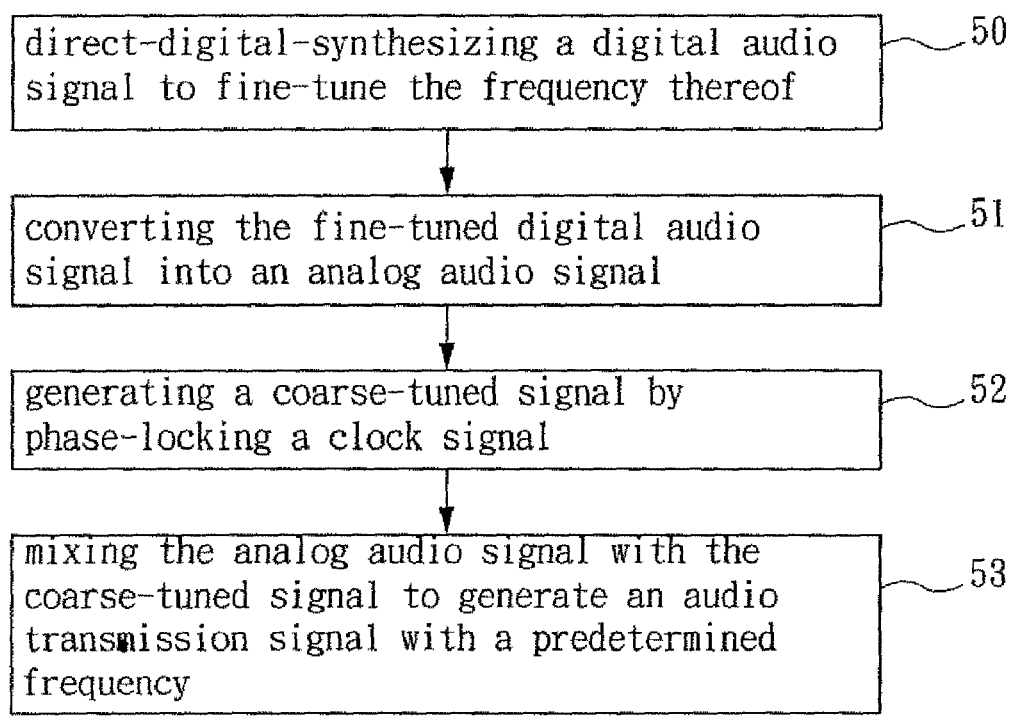
FIG. 5 is a flow chart of an audio conversion method according to another preferred embodiment of the present invention.

FIG. 5 is a flow chart of an audio conversion method according to another preferred embodiment of the present invention. The audio conversion method includes the following steps:

Step 50: direct-digital-synthesizing a digital audio signal to fine-tune the frequency thereof.

Step 51: converting the fine-tuned digital audio signal into an analog audio signal.

Step 52: generating a coarse-tuned signal by phase-locking a clock signal.

Step 53: mixing the analog audio signal with the coarse-tuned signal to generate an audio transmission signal with a predetermined frequency.

In Step 40 and Step 53, the predetermined frequency can be selected in the FM frequency band. Therefore, the flowcharts in FIGS. 4 and 5 can be applied to the FM transmitter.

While the present invention has been shown and described with reference to the preferred embodiments thereof and the illustrative drawings, it should not be considered as limited thereby. Various possible modifications and alterations can be conceived by persons skilled without departing from the scope and the spirit of the present invention.

What is claimed is:

1. An apparatus for audio conversion to generate an audio transmission signal with a predetermined frequency in an FM frequency band comprising:
    a digital FM (frequency modulation) modulator for modulating a digital audio input signal into a first digital audio signal;
    a digital frequency synthesizer for frequency-synthesizing the first digital audio signal in a fine-tuning manner into a second digital audio signal;
    a signal converter, coupled to the digital frequency synthesizer, for converting the second digital audio signal into an analog audio signal;
    an analog frequency converter, coupled to the signal converter, for generating the audio transmission signal with the predetermined frequency in a coarse-tuning manner according to a second clock signal and the analog audio signal while the second clock signal is generated according to a first clock signal; and
    a lookup table, for storing a first frequency conversion parameter and a second frequency conversion parameter,
    wherein a frequency of the second digital audio signal is determined according to a first frequency conversion parameter, and a frequency of the second clock signal is determined according to a frequency of the first clock signal and a second frequency conversion parameter, so that the predetermined frequency is determined according to the frequency of the second clock signal and a frequency of the analog audio signal.

2. The apparatus of claim 1, wherein the first digital audio signal is an FM audio signal.

3. The apparatus of claim 2, wherein the apparatus is applied to an FM transmitter.

4. The apparatus of claim 1, wherein the apparatus is integrated into a single integrated circuit (IC).

5. The apparatus of claim 1, wherein the digital frequency synthesizer comprises a direct digital synthesizer (DDS).

6. The apparatus of claim 1, wherein the signal converter comprises:
    a digital-to-analog converter for converting the second digital audio signal into the analog audio signal.

7. The apparatus of claim 6, wherein the signal converter further comprises:
    a low pass filter for low-pass filtering the analog audio signal.

8. The apparatus of claim 1, wherein the analog frequency converter comprises:
    a phase locked loop for generating the second clock signal according to the first clock signal by phase-locking.

9. The apparatus of claim 8, wherein the frequency of the second clock signal is determined according to a product of the frequency of the first clock signal and the second frequency conversion parameter.

10. The apparatus of claim 1, wherein the analog frequency converter comprises:
    a mixer for generating the audio transmission signal according to the second clock signal and the analog audio signal.

11. A method for audio conversion comprising steps of:
    frequency-synthesizing a first digital audio signal in a fine-tuning manner into a second digital audio signal, wherein a frequency of the second digital audio signal is determined according to a first frequency conversion parameter;
    converting the second digital audio signal into an analog audio signal;
    generating a second clock signal according to a first clock signal, wherein a frequency of the second clock signal is determined according to a frequency of the first clock signal and a second frequency conversion parameter; and generating an audio transmission signal with a predetermined frequency in a coarse-tuning manner according to the second clock signal and the analog audio signal, wherein the predetermined frequency of the audio transmission signal is determined according to the frequency of the second clock signal and a frequency of the analog audio signal;

wherein the first frequency conversion parameter and the second frequency conversion parameter are read from a lookup table for storing the first frequency conversion parameter and the second frequency conversion parameter.

12. The method of claim 11, wherein the first digital audio signal is a digital FM audio signal, and the predetermined frequency of the audio transmission signal lies in an FM frequency band.

13. The method of claim 12, further comprising:
modulating a digital audio input signal into the digital FM audio signal.

14. The method of claim 11, prior to the step of generating the audio transmission signal further comprising:
low-pass filtering the analog audio signal.

15. The method of claim 11, wherein the frequency of the second clock signal is determined according to a product of the frequency of the first clock signal and the second frequency conversion parameter.

* * * * *